(12) United States Patent
Liu et al.

(10) Patent No.: US 9,632,523 B2
(45) Date of Patent: Apr. 25, 2017

(54) PEAK DETECTOR FOR AMPLIFIER

(71) Applicant: MARVELL WORLD TRADE LTD, St. Michael (BB)

(72) Inventors: Ruiqiang Liu, Shanghai (CN); Hongzheng Han, Shanghai (CN); Tuo Wu, Shanghai (CN)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/510,467

(22) Filed: Oct. 9, 2014

(65) Prior Publication Data

US 2015/0102796 A1 Apr. 16, 2015

Related U.S. Application Data

(60) Provisional application No. 61/889,792, filed on Oct. 11, 2013.

(51) Int. Cl.
| | |
|---|---|
| *G05F 5/00* | (2006.01) |
| *G01R 19/00* | (2006.01) |
| *H02M 3/156* | (2006.01) |

(52) U.S. Cl.
CPC ............ *G05F 5/00* (2013.01); *G01R 19/00* (2013.01); *H02M 3/156* (2013.01)

(58) Field of Classification Search
CPC ........................................................ G05F 5/00

USPC .......................................................... 323/303

See application file for complete search history.

(56) References Cited

U.S. PATENT DOCUMENTS

| | | | | |
|---|---|---|---|---|
| 5,317,499 A | * | 5/1994 | Brakus | H02M 3/33546 363/127 |
| 6,178,100 B1 | * | 1/2001 | Kitano | H02M 3/3385 363/19 |
| 2009/0149150 A1 | * | 6/2009 | Buer | H03D 7/02 455/326 |
| 2012/0226385 A1 | * | 9/2012 | Williams | H05B 37/0227 700/295 |
| 2013/0114307 A1 | * | 5/2013 | Fang | H02M 1/32 363/21.01 |
| 2014/0312969 A1 | * | 10/2014 | Hamond | H02M 3/335 330/251 |

* cited by examiner

*Primary Examiner* — Adolf Berhane
*Assistant Examiner* — Afework Demisse

(57) ABSTRACT

Aspects of the disclosure provide a circuit for peak voltage detection. The circuit includes a diode-based peak detector and a compensation circuit. The diode-based peak detector has a first diode, and is configured to receive a signal for peak voltage detection and generate a first voltage of a stable level indicative of a peak voltage of the signal based on the first diode. The compensation circuit has a second diode. The compensation circuit is configured to receive the first voltage and generate a second voltage of a stable level that is independent of the first diode.

20 Claims, 2 Drawing Sheets

PEAK DETECTOR FOR AMPLIFIER

INCORPORATION BY REFERENCE

This present disclosure claims the benefit of U.S. Provisional Application No. 61/889,792, "Peak Detector of Amplifier" filed on Oct. 11, 2013, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In certain circuits, transistors, such as bipolar transistors, metal-oxide-semiconductor field effect transistors (MOSFETs), and the like, are subjected to a voltage that is much higher than a supply voltage. In an example, a transistor used in a class E amplifier is subjected to a peak voltage that is more than three times of a power supply voltage.

SUMMARY

Aspects of the disclosure provide a circuit for peak voltage detection. The circuit includes a diode-based peak detector and a compensation circuit. The diode-based peak detector has a first diode, and is configured to receive a signal for peak voltage detection and generate a first voltage of a stable level indicative of a peak voltage of the signal based on the first diode. The compensation circuit has a second diode. The compensation circuit is configured to receive the first voltage and generate a second voltage of a stable level that is independent of the first diode.

According to an aspect of the disclosure, the diode-based peak detector includes the first diode configured to receive the signal at a cathode of the first diode, and a capacitor coupled to an anode of the first diode to be charged according to the signal via the first diode to generate the first voltage. Further, in an embodiment, the compensation circuit includes a resistor network configured to cause the second voltage to be scaled down, and the second diode is configured to match the first diode.

In an embodiment, the diode-based peak detector is coupled to a transistor used in a Class E power amplifier. The circuit further includes a controller configured to adjust a power supply to the class E power amplifier based on the second voltage.

Aspects of the disclosure provide a method for peak detection. The method includes receiving a signal for peak voltage detection, generating, based on a first diode, a first voltage of a stable level indicative of a peak voltage of the signal, and compensating, based on a second diode, a diode dependency in the first voltage to generate a second voltage of a stable level without the diode dependency.

Aspects of the disclosure provide an apparatus that includes an amplifier circuit, a diode-based peak detector and a compensation circuit. The amplifier circuit is configured to output a signal for peak detection. The diode-based peak detector includes a first diode. The diode-based peak detector is configured to receive the signal for peak detection and generate a first voltage of a stable level indicative of a peak voltage of the signal. The compensation circuit has a second diode. The compensation circuit is configured to receive the first voltage and generate a second voltage of a stable level that is independent of the first diode.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
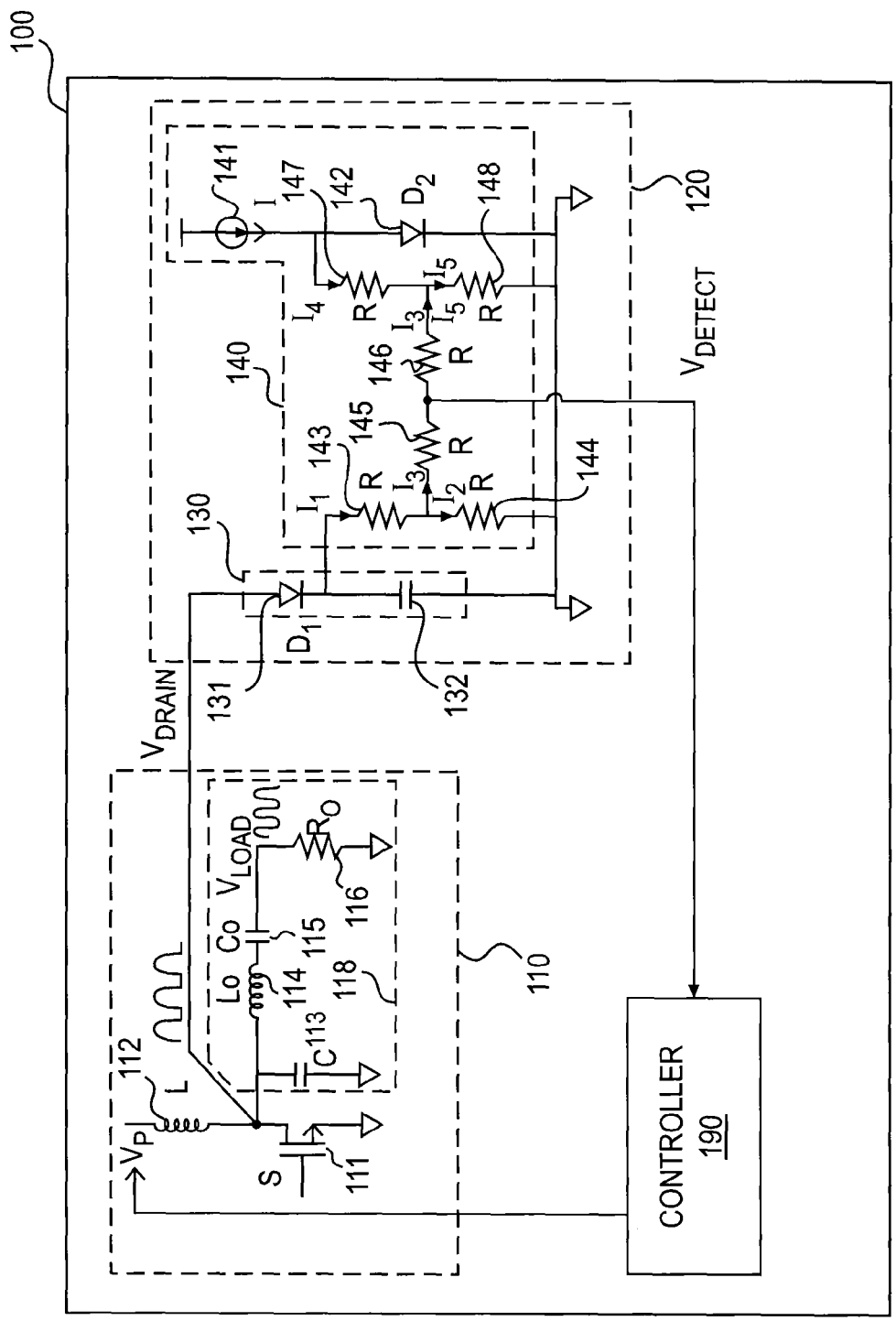
FIG. 1 shows a diagram of an electronic device 100 according to an embodiment of the disclosure.

FIG. 1 shows a diagram of an electronic device 100 according to an embodiment of the disclosure. The electronic device 100 includes a peak detector 120 configured to detect a peak voltage of a signal. The peak detector 120 is configured to achieve substantially consistent peak voltage detection in spite of variations, such as process variation, temperature variation and the like.

The electronic device 100 can be any suitable device, such as a desktop computer, a laptop computer, a tablet computer, a mobile device, a cell phone, a smart phone, a wireless access point, a modem and the like, that includes an amplifier circuit. In an embodiment, the peak detector 120 is configured to detect a peak voltage in the amplifier circuit. The peak voltage is used to control a power supply to the amplifier circuit to protect electronic components in the amplifier circuit from voltage stress.

In the FIG. 1 example, the electronic device 100 includes an amplifier circuit 110 and a controller 190 coupled with the peak detector 120 as shown in FIG. 1. The amplifier circuit 110 includes one or more transistors, such as a bipolar transistor, a metal-oxide-semiconductor field effect transistor (MOSFET), and the like. When a voltage across a transistor is larger than a limit, the transistor is under a voltage stress. The voltage stress causes electrical parameters of the transistor to drift away, and thus degrades circuit performance. Further, the transistor can be permanently damaged when the voltage stress is too large.

Specifically, in the example, the amplifier circuit 110 is a power amplifier and has a Class E power amplifier topology. For example, the amplifier circuit 110 includes a MOSFET transistor 111, a first inductor 112, and a load network 118. The first inductor 112 is coupled between a power supply $V_P$ and the drain terminal of the MOSFET transistor 111. The load network 118 is configured to provide required phase shift for the operations of the Class E power simplifier.

In the FIG. 1 example, the load network 118 includes a first capacitor 113, a second inductor 114, a second capacitor 115, and a resistive load 116. The first capacitor 113 is a shunt capacitor. In an example, the first capacitor 113 collectively represents intrinsic source-drain parasitic capacitance of the MOSFET transistor 111 and external circuit capacitor added by the load network 118. The second inductor 114 and the second capacitor 115 form a series LC circuit. The inductance and capacitance of electronic components in the load network 118 are suitably tuned to enable the MOSFET transistor 111 to operate as a substantially perfect switch switching between an on-state and an off-state.

According to an aspect of the disclosure, the inductance and capacitance of the electronic components in the load network 118 are suitably tuned to shape the current and voltage waveforms of the MOSFET transistor 111 not to overlap high current simultaneously with high voltage in order to minimize power dissipation by the MOSFET transistor 111 and maximize the power amplifier efficiency. When the MOSFET transistor 111 is turned on to conduct current, the voltage drop on the MOSFET transistor 111 is about zero, thus the power dissipation on the MOSFET transistor 111 is about zero; when the MOSFET transistor 111 is turned off, the current flowing through the MOSFET transistor 111 is about zero, thus the power dissipation on the MOSFET transistor 111 is about zero.

Further, in an embodiment, the power dissipation on the MOSFET transistor 111 during switching is about zero. For example, once the MOSFET transistor 111 is turned on to start conducting current, the load network 118 enables the source-drain voltage of the MOSFET transistor 111 to sharply drop to zero, thus the power consumption by the MOSFET transistor 111 is about zero during switching. Thus, the amplifier circuit 110 is suitably used for power amplification of a high frequency signal, such as a radio frequency (RF) signal, a microwave frequency signal, and the like. In an example, the electronic device 100 includes a transmitter configured to transmit RF signals. The amplifier circuit 110 is used in the transmitter to power amplify the RF signals. For example, the gate terminal of the MOSFET transistor 111 receives, for example, an RF signal for transmission, and the amplifier circuit 110 power amplifies the RF signal and transmits the amplified RF signal as electromagnetic waves in the air.

According to an aspect of the disclosure, when the MOSFET transistor 111 is turned off, the voltage on the drain terminal of the MOSFET transistor 111 can be higher than the DC input voltage $V_P$ due to the existence and operation of the first inductor 112. In an example, the peak voltage on the drain terminal of the MOSFET transistor 111 is more than three times of the DC input voltage $V_P$. In an example, the DC input voltage $V_P$ is 1.5V, and the peak voltage on the drain terminal is about 4.5V.

In an embodiment, as process scales down, a maximum voltage across a transistor without causing transistor parameter drifting also goes down. Once a voltage across a transistor exceeds the maximum voltage, parameters of the transistor drift away, and physical behavior of the transistor may change.

In the FIG. 1 example, the amplifier circuit 110, the peak detector 120 and the controller 190 form a control loop to limit the peak voltage across the MOSFET transistor 111 in order to avoid voltage stress on the MOSFET transistor 111. The peak detector 120 detects a peak voltage of a node in the amplifier circuit 110, such as a drain voltage $V_{DRAIN}$ of the MOSFET transistor, a load voltage $V_{LOAD}$ on the resistive load 116, and the like, and provides the peak voltage to the controller 190. In an example, the controller 190 controls the level of the DC input voltage $V_P$ to limit the peak voltage across the MOSFET transistor 111 below the maximum voltage.

According to an aspect of the disclosure, the peak detector 120 generates a detection voltage $V_{DETECT}$ indicative of the peak voltage level of the drain voltage $V_{DRAIN}$. The detection voltage $V_{DETECT}$ is relatively constant in spite of process variation and the temperature variation.

Specifically, the peak detector 120 includes a diode-based peak detector 130 and a compensation circuit 140. The diode-based peak detector 130 includes a first diode 131 and a capacitor 132. The compensation circuit 140 includes a current source 141, a second diode 142 and a resistor network formed by resistors 143-148. These elements are coupled together as shown in FIG. 1.

In the FIG. 1 example, when the drain voltage $V_{DRAIN}$ is larger than the voltage level on the capacitor 132, the first diode 131 is forward biased to charge the capacitor 132. When the drain voltage $V_{DRAIN}$ is smaller than the voltage level on the capacitor 132, the first diode 131 is reverse-biased, and the capacitor 132 holds the voltage. Thus, the voltage level on the capacitor 132 can be represented as $V_{PEAK}-V_{D1}$, where $V_{PEAK}$ is the peak voltage of the drain voltage $V_{DRAIN}$, and $V_{D1}$ is the forward voltage drop of the first diode 131. The voltage level on the capacitor 132 is a function of the forward voltage drop of the diode 131. The forward voltage drop varies with process and temperature.

The compensation circuit 140 is configured to compensate for the diode parameter dependence, and to generate a detection voltage $V_{DETECT}$ independent of the diode parameters. For example, the second diode 142 is a matching diode of the first diode 131. In an example, the second diode 142 and the first diode 131 are of the same sized and are formed of the same layers by integrated circuit (IC) manufacturing. Thus, the forward voltage drop of the second diode 142 $V_{D2}$ is substantially the same as the forward voltage drop of the first diode 131 $V_{D1}$. Further, the resistor network is configured to scale the peak voltage. In the FIG. 1 example, the resistors 143-148 are matching resistors having substantially the same resistance R. The relationship of the peak voltage $V_{PEAK}$ and the detection voltage $V_{DETECT}$ can be calculated according to Equations 1-5, where $I_1$ denotes the current flowing through the resistor 143, $I_2$ denotes the current flowing through the resistor 144, $I_3$ denotes the current flowing through the resistors 145 and 146, $I_4$ denotes the current flowing through the resistor 147 and $I_5$ denotes the current flowing through the resistor 148.

$$V_{PEAK} = I_1 \times R + I_2 \times R + V_{D1} \qquad \text{Eq. 1}$$

$$V_{PEAK} = (I_2 + I_3) \times R + I_2 \times R + V_{D2} \qquad \text{Eq. 2}$$

$$V_{PEAK} = 2 \times I_2 \times R + I_3 \times R + I_4 \times R + I_5 \times R \qquad \text{Eq. 3}$$

$$V_{PEAK} = 2 \times (I_3 \times 2R + I_5 \times R) + I_3 \times R + (I_5 - I_3) \times R + I_5 \times R \qquad \text{Eq. 4}$$

$$V_{Peak} = 4 \times I_3 \times R + 4 \times I_5 \times R = 4 \times V_{DETECT} \qquad \text{Eq. 5}$$

As shown by Eq. 5, the peak voltage $V_{PEAK}$ is four times of the detection voltage $V_{DETECT}$. Thus, the detection voltage $V_{DETECT}$ is indicative the voltage level of the peak voltage $V_{PEAK}$, and is independent of the first diode 131 and the second diode 142, and thus is substantially constant in spite of process variation and temperature variation.

According to an aspect of the disclosure, the resistance of the resistors 143-148 and the capacitance of the capacitor 132 can be suitably chosen to have a RC constant that is enough to track changes in the peak voltage $V_{PEAK}$.

In an example, the peak detector 120 is simulated under process variation and temperature variation. In the example, three process corners (FF, TT and SS) and three temperatures (−40° C., 50° C., and 125° C.) are used in the simulation. The FF process corner refers to fast N-channel MOSFET and fast P-channel MOSFET. The TT process corner refers to typical N-channel MOSFET and typical P-channel MOSFET. The SS process corner refers to slow N-channel MOSFET and slow P-channel MOSFET. According to the simulation, the voltage variation for the detection voltage $V_{DETECT}$ is 13.9 mV (0.12 dB) across the process variation and the temperature variation.

According to an aspect of the disclosure, when the detection voltage $V_{DETECT}$ accurately represents the peak voltage level for the drain voltage $V_{DRAIN}$, the amplifier circuit 110 can be designed without sacrificing too much design margin. In an embodiment, the amplifier circuit 110 is designed to have relaxed margins for the supply voltage, the load impedance and efficiency.

According to another aspect of the disclosure, the peak detector 120 is directly coupled to the drain of the MOSFET transistor 111 to obtain both DC and AC information. There is no need for an attenuator circuit. Further, the peak detector 120 adds a light load to the amplifier circuit 110, and influence to the performance of the amplifier circuit 110 is very small and can be neglected in an example. In addition, in an example, the peak detector 120 is configured to have a relatively small current consumption, and occupy a relatively small silicon area.

Figure 2:
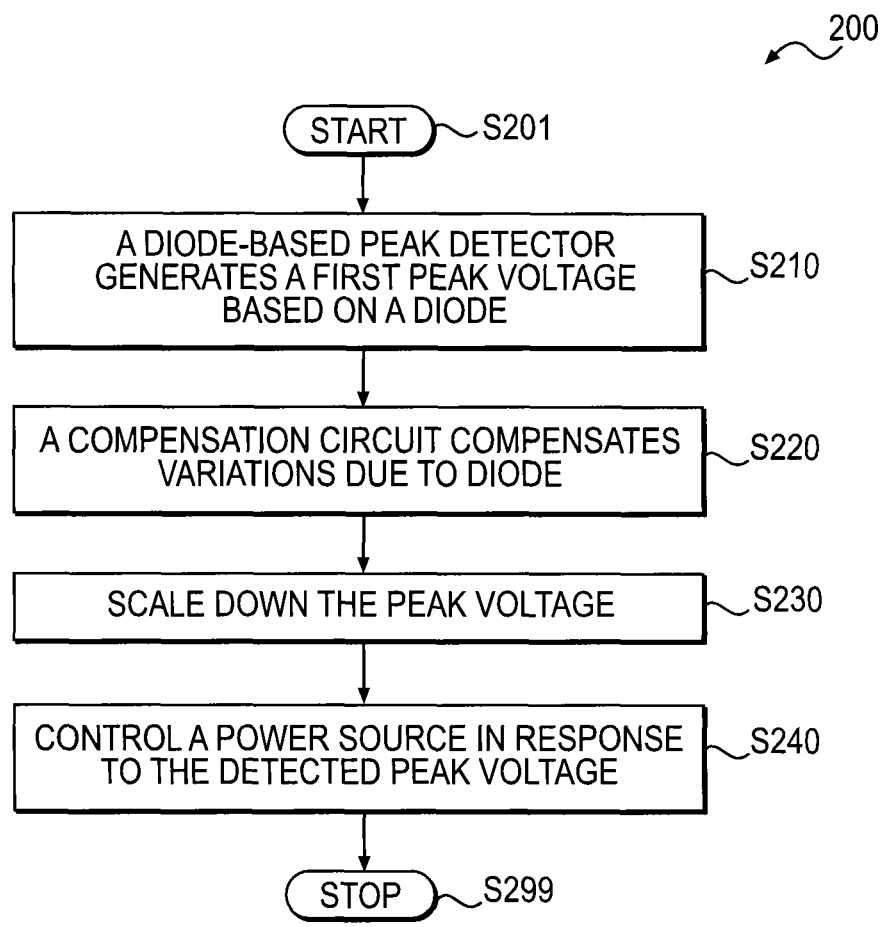
FIG. 2 shows a flow chart outlining a process 200 according to an embodiment of the disclosure.

FIG. 2 shows a flow chart outlining a process example 200 according to an embodiment of the disclosure. In an example, the process 200 is executed in the electronic device 100 to detect a peak voltage and control a supply voltage based on the detected peak voltage. The process starts at S201, and proceeds to S210.

At S210, a diode-based peak detector generates a first peak voltage based on a diode. In the FIG. 1 example, the diode-based peak detector 130 is coupled to the drain of the MOSFET 111 to detect the peak voltage of the drain voltage. Specifically, when the drain voltage $V_{DRAIN}$ is larger than the voltage level on the capacitor 132, the first diode 131 is forward-biased to charge the capacitor 132, and the voltage level on the capacitor 132 increases. When the drain voltage $V_{DRAIN}$ is smaller than the voltage level on the capacitor 132, the first diode 131 is reverse-biased, and the capacitor 132 holds the voltage level. Thus, the voltage level on the capacitor 132 can be represented as $V_{PEAK-VD1}$, where $V_{PEAK}$ is the peak voltage of the drain voltage $V_{DRAIN}$, and $V_{D1}$ is the forward voltage drop of the first diode 131. The voltage level on the capacitor 132 is a function of the forward voltage drop of the first diode 131. The forward voltage drop varies with process and temperature.

At S220, a compensation circuit compensates variations due to the diode. In the FIG. 1 example, the compensation circuit 140 compensates for the diode parameter dependence, and generates a detection voltage $V_{DETECT}$ independent of the diode parameters. For example, the second diode 142 matches the first diode 131, and the forward voltage drop of the second diode 142 $V_{D2}$ is substantially the same as the forward voltage drop of the first diode 131 $V_{D1}$. The compensation circuit 140 is configured to use the second diode 142 to compensate for the dependence of the peak voltage detection on the first diode 131.

At S230, the peak detection voltage is scaled down. In the FIG. 1 example, the peak voltage of the drain of MOSFET 111 can be more than three times of the supply voltage $V_P$. Thus, the compensation circuit 140 uses the resistor network formed by the resistors 143-148 to scale down the detected peak voltage, and generate the detection voltage $V_{DETECT}$. As shown by Eq. 5, the peak voltage $V_{PEAK}$ is four times of the detection voltage $V_{DETECT}$. Thus, the detection voltage $V_{DETECT}$ is indicative the voltage level of the peak voltage $V_{PEAK}$, and is independent of the first diode 131 and the second diode 142, and thus independent of the process variation and temperature variation.

At S240, a power source is controlled in response to the detected peak voltage. In the FIG. 1 example, the controller 190 receives the detection voltage $V_{DETECT}$, and adjusts the power supply voltage $V_P$ based on the detection voltage $V_{DETECT}$. In an example, when the detection voltage $V_{DETECT}$ is larger than a threshold, the controller 190 reduces the level of the power supply voltage $V_P$, such that the voltage across the MOSFET transistor 111 is below a limit, such as the maximum voltage without causing parameter drifting. Then, the process proceeds to S299 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit for peak voltage detection, comprising:
   a diode-based peak detector having a first diode, the diode-based peak detector configured to receive a signal for peak voltage detection and generate a first voltage of a stable level indicative of a peak voltage of the signal based on the first diode; and
   a compensation circuit having a second diode, the compensation circuit configured to receive the first voltage and generate a second voltage of a stable level that is independent of the first diode, the second diode configured to match the first diode, and the second diode being coupled with more than two resistors, a first resistor being coupled in series with a second resistor, the first resistor and the second resistor together coupled in parallel with a capacitor, the first resistor, the second resistor, and the capacitor together coupled in series with the first diode, a third resistor coupled between the first resistor and the second resistor, and a fourth resistor coupled in series with the third resistor.

2. The circuit of claim 1, wherein the diode-based peak detector further comprises:
   the first diode configured to receive the signal at a cathode of the first diode; and
   the capacitor coupled to an anode of the first diode to be charged by the signal via the first diode to generate the first voltage.

3. The circuit of claim 1, wherein the diode-based peak detector is configured to receive the signal having an AC component.

4. The circuit of claim 1, wherein the compensation circuit further comprises:
   a capacitor coupled with the second diode directly via a ground.

5. The circuit of claim 1, wherein the diode-based peak detector is configured to receive the signal output from an amplifier.

6. The circuit of claim 1, wherein the diode-based peak detector is coupled to a transistor used in a Class E power amplifier.

7. The circuit of claim 6, further comprising:
   a controller configured to adjust a power supply to the class E power amplifier based on the second voltage.

8. A method, comprising:
   receiving a signal for peak voltage detection;
   generating, based on a first diode, a first voltage of a stable level indicative of a peak voltage of the signal; and
   compensating, based on a second diode, a diode dependency in the first voltage to generate a second voltage of a stable level without the diode dependency, wherein the second diode configured to match the first diode, and the second diode being coupled with more than two resistors, a first resistor being coupled in series with a second resistor, the first resistor and the second resistor together coupled in parallel with a capacitor, the first resistor, the second resistor, and the capacitor together coupled in series with the first diode, a third resistor coupled between the first resistor and the second resistor, and a fourth resistor coupled in series with the third resistor.

9. The method of claim 8, further comprising:
receiving the signal at a cathode of the first diode; and
charging the capacitor coupled to an anode of the first diode to generate the first voltage.

10. The method of claim 8, wherein receiving the signal for peak detection comprises:
receiving the signal having an AC component for peak detection.

11. The method of claim 8, further comprising:
causing the second voltage to be scaled down below a supply voltage level.

12. The method of claim 8, wherein receiving the signal for peak detection comprises:
receiving the signal output from an amplifier circuit.

13. The method of claim 8, wherein receiving the signal for peak detection comprises:
receiving the signal output from a transistor used in a Class E power amplifier.

14. The method of claim 13, further comprising:
adjusting a voltage level of a power supply to the class E power amplifier based on the second voltage.

15. An apparatus, comprising:
an amplifier circuit configured to output a signal for peak detection;
a diode-based peak detector having a first diode, the diode-based peak detector configured to receive the signal for peak detection and generate a first voltage of a stable level indicative of a peak voltage of the signal based on the first diode; and
a compensation circuit having a second diode, the compensation circuit configured to receive the first voltage and generate a second voltage of a stable level that is independent of the first diode, the second diode configured to match the first diode, and the second diode being coupled with more than two resistors, a first resistor being coupled in series with a second resistor, the first resistor and the second resistor together coupled in parallel with a capacitor, the first resistor, the second resistor, and the capacitor together coupled in series with the first diode, a third resistor coupled between the first resistor and the second resistor, and a fourth resistor coupled in series with the third resistor.

16. The apparatus of claim 15, wherein the diode-based peak detector further comprises:
the first diode configured to receive the signal at a cathode of the first diode; and
the capacitor coupled to an anode of the first diode to be charged by the signal via the first diode to generate the first voltage.

17. The apparatus of claim 15, wherein the amplifier circuit is configured to output the signal having an AC component.

18. The apparatus of claim 15, wherein the compensation circuit further comprises:
a resistor network configured to cause the second voltage to be scaled down.

19. The apparatus of claim 15, wherein the amplifier circuit is a Class E power amplifier.

20. The apparatus of claim 19, further comprising:
a controller configured to adjust a power supply o the class E power amplifier based on the second voltage.

* * * * *